US012684914B2

(12) United States Patent
Pertuit et al.

(10) Patent No.: US 12,684,914 B2
(45) Date of Patent: Jul. 14, 2026

(54) LUMIPHORIC MATERIAL STRUCTURES FOR LIGHT- EMITTING DIODE PACKAGES AND RELATED METHODS

(71) Applicant: CreeLED, Inc., Durham, NC (US)

(72) Inventors: Andre Pertuit, Raleigh, NC (US); Michael Check, Holly Springs, NC (US); David Suich, Durham, NC (US); Colin Blakely, Raleigh, NC (US); Robert Wilcox, Rolesville, NC (US)

(73) Assignee: CreeLED, Inc., Durham, NC (US)

( * ) Notice: Subject to any disclaimer, the term of this patent is extended or adjusted under 35 U.S.C. 154(b) by 456 days.

(21) Appl. No.: 18/053,570

(22) Filed: Nov. 8, 2022

(65) Prior Publication Data

US 2024/0154076 A1     May 9, 2024

(51) Int. Cl.
*H10H 20/854*       (2025.01)
*H10H 20/851*       (2025.01)
(Continued)

(52) U.S. Cl.
CPC ...... *H10H 20/854* (2025.01); *H10H 20/8516* (2025.01); *H10H 20/853* (2025.01);
(Continued)

(58) Field of Classification Search
CPC ............. H10H 20/851; H10H 20/8512; H10H 20/8513; H10H 20/8516
See application file for complete search history.

(56) References Cited

U.S. PATENT DOCUMENTS

| 7,554,258 B2 * | 6/2009 | Rossner | ................... C04B 35/44 |
| | | | 313/503 |
| 7,737,621 B2 * | 6/2010 | Masuda | ............. C09K 11/7739 |
| | | | 313/485 |

(Continued)

FOREIGN PATENT DOCUMENTS

| CN | 107910426 A | * | 4/2018 | ......... H10H 20/8516 |
| CN | 109301056 A | * | 2/2019 | ....... G02F 1/133603 |

(Continued)

OTHER PUBLICATIONS

U.S. Appl. No. 17/173,735.*
U.S. Appl. No. 18/163,391.*

*Primary Examiner* — David A Zarneke
(74) *Attorney, Agent, or Firm* — Withrow & Terranova, P.L.L.C.

(57) ABSTRACT

Solid-state lighting devices including light-emitting diodes (LEDs) and more particularly lumiphoric material structures for LED packages and related methods are disclosed. Cover structures with predefined color points for LED packages may include multiple lumiphoric material structures that are bonded together and arranged within LED packages. Lumiphoric material structures may include preformed and hardened structures, such as phosphor-in-glass or phosphor-in-ceramic, that are bonded together to form cover structures. Certain lumiphoric material structures include multiple sublayers of varying quantities and/or compositions of lumiphoric materials. Lumiphoric material structures with targeted color points may also be reduced to powder form and mixed within a binder for application in LED packages. Related methods include preforming cover structures of bonded lumiphoric material structures or assembling cover structures at a package level by separately arranging each lumiphoric material structure within LED packages.

10 Claims, 8 Drawing Sheets

(51) Int. Cl.
  *H10H 20/853* (2025.01)
  *H10H 20/858* (2025.01)
(52) U.S. Cl.
  CPC ....... *H10H 20/8581* (2025.01); *H10H 20/851*
  (2025.01); *H10H 20/8512* (2025.01); *H10H*
  *20/8513* (2025.01)

(56) References Cited

U.S. PATENT DOCUMENTS

| | | | | |
|---|---|---|---|---|
| 8,513,872 | B2 * | 8/2013 | Annen | B82Y 30/00 |
| | | | | 313/501 |
| 8,729,788 | B2 * | 5/2014 | Masuda | C09K 11/7739 |
| | | | | 313/487 |
| 8,841,684 | B2 * | 9/2014 | Ishihara | H10H 20/8514 |
| | | | | 438/22 |
| 9,142,732 | B2 * | 9/2015 | Luo | H10H 20/8513 |
| 9,175,830 | B2 * | 11/2015 | Yang | F21V 9/08 |
| 9,347,646 | B2 * | 5/2016 | Kim | H10H 20/8513 |
| 10,290,777 | B2 * | 5/2019 | Andrews | H10H 20/857 |
| 10,727,379 | B2 * | 7/2020 | Piquette | H10H 20/8513 |
| 12,443,831 | B1 * | 10/2025 | Fan | G06N 3/063 |
| 2009/0039375 | A1 * | 2/2009 | LeToquin | H10H 20/8513 |
| | | | | 257/E33.061 |
| 2010/0006880 | A1 * | 1/2010 | Wang | H10H 20/852 |
| | | | | 257/E33.059 |
| 2010/0012964 | A1 * | 1/2010 | Copic | H10H 20/8513 |
| | | | | 264/21 |
| 2012/0305970 | A1 * | 12/2012 | Kim | H10H 20/8513 |
| | | | | 257/E33.072 |
| 2013/0001605 | A1 * | 1/2013 | Ishihara | H10H 20/8514 |
| | | | | 257/E33.061 |
| 2020/0243726 | A1 * | 7/2020 | Shimizu | C09K 11/02 |
| 2020/0411730 | A1 * | 12/2020 | Andrews | H10H 29/14 |
| 2022/0254962 | A1 | 8/2022 | Miller et al. | |

FOREIGN PATENT DOCUMENTS

| | | | | | |
|---|---|---|---|---|---|
| CN | 110391323 | A | * | 10/2019 | H10H 20/85 |
| CN | 116190533 | A | * | 5/2023 | H10H 20/8514 |

* cited by examiner

LUMIPHORIC MATERIAL STRUCTURES FOR LIGHT- EMITTING DIODE PACKAGES AND RELATED METHODS

FIELD OF THE DISCLOSURE

The present disclosure relates to solid-state lighting devices including light-emitting diodes (LEDs), and more particularly to lumiphoric material structures for LED packages and related methods.

BACKGROUND

Solid-state lighting devices such as light-emitting diodes (LEDs) are increasingly used in both consumer and commercial applications. Advancements in LED technology have resulted in highly efficient and mechanically robust light sources with a long service life. Accordingly, modern LEDs have enabled a variety of new display applications and are being increasingly utilized for general illumination applications, often replacing incandescent and fluorescent light sources.

LEDs are solid-state devices that convert electrical energy to light and generally include one or more active layers of semiconductor material (or an active region) arranged between oppositely doped n-type and p-type layers. When a bias is applied across the doped layers, holes and electrons are injected into the one or more active layers where they recombine to generate emissions such as visible light or ultraviolet emissions. An LED chip typically includes an active region that may be fabricated, for example, from silicon carbide, gallium nitride, gallium phosphide, aluminum nitride, gallium arsenide-based materials, and/or from organic semiconductor materials. Photons generated by the active region are initiated in all directions. Lumiphoric materials may be arranged that convert at least some light generated from the active regions of LED chips to a different wavelength.

LED packages have been developed that provide mechanical support, electrical connections, and encapsulation for LED emitters and lumiphoric materials. As LED technology continues to advance, LED packages are needed that emit light of high color quality for various applications in small sizes. Despite recent advances in LED package technology, there can still be challenges in producing high quality light with desired emission characteristics while also providing high light emission efficiency in LED packages.

The art continues to seek improved LEDs and solid-state lighting devices having desirable illumination characteristics capable of overcoming challenges associated with conventional LED devices.

SUMMARY

The present disclosure relates to solid-state lighting devices including light-emitting diodes (LEDs), and more particularly to lumiphoric material structures for LED packages and related methods. Cover structures with predefined color points for LED packages may include multiple lumiphoric material structures that are bonded together and arranged within LED packages. Lumiphoric material structures may include preformed and hardened structures, such as phosphor-in-glass or phosphor-in-ceramic, that are bonded together to form cover structures. Certain lumiphoric material structures include multiple sublayers of varying quantities and/or compositions of lumiphoric materials. Lumiphoric material structures with targeted color points may also be reduced to powder form and mixed within a binder for application in LED packages. Related methods include preforming cover structures of bonded lumiphoric material structures or assembling cover structures at a package level by separately arranging each lumiphoric material structure within LED packages.

In one aspect, an LED package comprises: a submount; at least one LED chip on the submount; and a cover structure on the at least on LED chip, the cover structure comprising a first lumiphoric material structure that is bonded to a second lumiphoric material structure. In certain embodiments, each of the first lumiphoric material structure and the second lumiphoric material structure comprises a phosphor-in-glass structure or a phosphor-in-ceramic structure. In certain embodiments the at least one LED chip is configured to emit light of a first peak wavelength; the first lumiphoric material structure is configured to convert a portion of the first peak wavelength to light of a second peak wavelength; the second lumiphoric material structure is configured to convert another portion of the first peak wavelength to light of a third peak wavelength; and the first peak wavelength, the second peak wavelength, and the third peak wavelength are all different from one another. In certain embodiments, the first lumiphoric material structure is arranged closer to the at least one LED chip than the second lumiphoric material structure; and the second peak wavelength is greater than the third peak wavelength.

In certain embodiments, the LED package further comprises an adhesive material between the first lumiphoric material structure and the second lumiphoric material structure. In certain embodiments, a first thickness of the first lumiphoric material structure is less than a second thickness of the second lumiphoric material structure. In certain embodiments, at least one of the first lumiphoric material structure and the second lumiphoric material structure comprises a plurality of sublayers with varying quantities or compositions of lumiphoric particles. In certain embodiments, at least one of the first lumiphoric material structure and the second lumiphoric material structure comprises a plurality of sublayers, and at least one sublayer of the plurality of sublayers comprises a first subregion that includes lumiphoric particles and a second subregion that is devoid of lumiphoric particles. In certain embodiments, the second subregion is laterally arranged about a perimeter of the first subregion. In certain embodiments, the cover structure comprises a third lumiphoric material structure that is bonded to the second lumiphoric material structure.

In another aspect, a method comprises: providing a first lumiphoric material structure, the first lumiphoric material structure comprising first lumiphoric particles in a first host material; providing a second lumiphoric material structure, the second lumiphoric material structure comprising second lumiphoric particles in a second host material; and bonding the first lumiphoric material structure to the second lumiphoric material structure. In certain embodiments, the first lumiphoric particles are configured to provide a different peak wavelength than the second lumiphoric particles.

The method may further comprise: mixing the first lumiphoric particles with the first host material and heating the first lumiphoric particles and the first host material to form the first lumiphoric material structure; and mixing the second lumiphoric particles with the second host material and heating the second lumiphoric particles and the second host material to form the second lumiphoric material structure. In certain embodiments, heating the first lumiphoric particles and the first host material comprises heating to a first temperature; heating the second lumiphoric particles and the second host material comprises heating to a second temperature; and the first temperature is lower than the second temperature. In certain embodiments, the first host material comprises a different material than the second host material.

The method may further comprise: reducing a thickness of the first lumiphoric material structure after bonding the first lumiphoric material structure to the second lumiphoric material structure. The method may further comprise: singulating the first lumiphoric material structure and the second lumiphoric material structure to form a plurality of cover structures for a plurality of LED packages; wherein each cover structure of the plurality of cover structures comprises a portion of the first lumiphoric material structure and a portion of the second lumiphoric material structure. In certain embodiments, the first lumiphoric material structure and the second lumiphoric material structure form a cover structure for an LED package. The method may further comprise attaching the cover structure to an LED chip within the LED package after the first lumiphoric material structure is bonded to the second lumiphoric material structure. The method may further comprise attaching the first lumiphoric material structure to an LED chip within the LED package before the first lumiphoric material structure is bonded to the second lumiphoric material structure.

In another aspect, an LED package comprises: a submount; at least one LED chip on the submount; and a plurality of particles over the at least one LED chip, each particle of the plurality of particles comprising a first sublayer with a first lumiphoric material and a second sublayer with a second lumiphoric material. In certain embodiments, the first lumiphoric material comprises a different composition than the second lumiphoric material. In certain embodiments, the first sublayer comprises the first lumiphoric material in a first host material of glass or ceramic, and the second sublayer comprises the second lumiphoric material in a second host material of glass or ceramic. In certain embodiments, the plurality of particles are distributed in a binder on a top surface of the at least one LED chip. In certain embodiments, the plurality of particles and the binder are further on a surface of the submount that is adjacent the at least one LED chip.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1A:
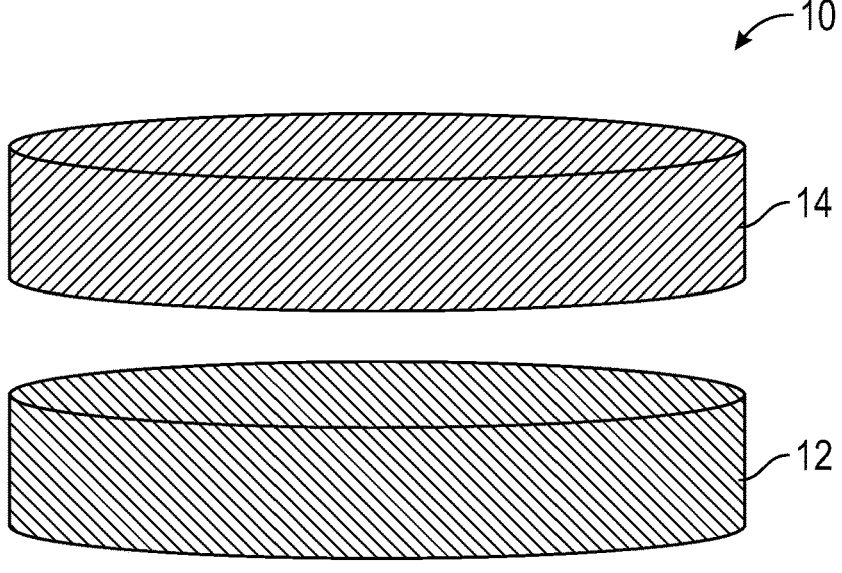
FIG. 1A is an illustration of a fabrication step for forming a cover structure that includes first and second lumiphoric material structures that are separately formed and hardened before being assembled together.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

The present disclosure relates to solid-state lighting devices including light-emitting diodes (LEDs), and more particularly to lumiphoric material structures for LED packages and related methods. Cover structures with predefined color points for LED packages may include multiple lumiphoric material structures that are bonded together and arranged within LED packages. Lumiphoric material structures may include preformed and hardened structures, such as phosphor-in-glass or phosphor-in-ceramic, that are bonded together to form cover structures. Certain lumiphoric material structures include multiple sublayers of varying quantities and/or compositions of lumiphoric materials. Lumiphoric material structures with targeted color points may also be reduced to powder form and mixed within a binder for application in LED packages. Related methods include preforming cover structures of bonded lumiphoric material structures or assembling cover structures at a package level by separately arranging each lumiphoric material structure within LED packages.

Before delving into specific details of various aspects of the present disclosure, an overview of various elements that may be included in exemplary LED packages of the present disclosure is provided for context. An LED chip typically comprises an active LED structure or region that can have many different semiconductor layers arranged in different ways. The fabrication and operation of LEDs and their active structures are generally known in the art and are only briefly discussed herein. The layers of the active LED structure can be fabricated using known processes with a suitable process being fabrication using metal organic chemical vapor deposition. The layers of the active LED structure can comprise many different layers and generally comprise an active layer sandwiched between n-type and p-type oppositely doped epitaxial layers, all of which are formed successively on a growth substrate. It is understood that additional layers and elements can also be included in the active LED structure, including, but not limited to, buffer layers, nucleation layers, super lattice structures, undoped layers, cladding layers, contact layers, and current-spreading layers and light extraction layers and elements. The active layer can comprise a single quantum well, a multiple quantum well, a double heterostructure, or super lattice structures.

The active LED structure can be fabricated from different material systems, with some material systems being Group III nitride-based material systems. Group III nitrides refer to those semiconductor compounds formed between nitrogen (N) and the elements in Group III of the periodic table, usually aluminum (Al), gallium (Ga), and indium (In). Gallium nitride (GaN) is a common binary compound. Group III nitrides also refer to ternary and quaternary compounds such as aluminum gallium nitride (AlGaN), indium gallium nitride (InGaN), and aluminum indium gallium nitride (AlInGaN). Other material systems include silicon carbide (SiC), organic semiconductor materials, and other Group III-V systems such as gallium phosphide (GaP), gallium arsenide (GaAs), and related compounds.

The active LED structure may be grown on a growth substrate that can include many materials, such as sapphire, SiC, aluminum nitride (AlN), and GaN. SiC has certain advantages, such as a closer crystal lattice match to Group III nitrides than other substrates and results in Group III nitride films of high quality. SiC also has a very high thermal conductivity so that the total output power of Group III nitride devices on SiC is not limited by the thermal dissipation of the substrate. Sapphire is another common substrate for Group III nitrides and also has certain advantages, including being lower cost, having established manufacturing processes, and having good light-transmissive optical properties.

Different embodiments of the active LED structure can emit different wavelengths of light depending on the composition of the active layer and n-type and p-type layers. In some embodiments, the active LED structure emits blue light with a peak wavelength range of approximately 430 nanometers (nm) to 480 nm. In other embodiments, the active LED structure emits green light with a peak wavelength range of 500 nm to 570 nm. In other embodiments, the active LED structure emits red light with a peak wavelength range of 600 nm to 650 nm. Other wavelength ranges include a range from 400 nm to about 430 nm and/or a range from 480 nm to 500 nm, among others, or any wavelength in a range from 400 nm to 750 nm. In certain embodiments, the active LED structure may be configured to emit light that is outside the visible spectrum, including one or more portions of the UV spectrum. The UV spectrum is typically divided into three wavelength range categories denoted with letters A, B, and C. In this manner, UV-A light is typically defined as a peak wavelength range from 315 nm to 400 nm, UV-B is typically defined as a peak wavelength range from 280 nm to 315 nm, and UV-C is typically defined as a peak wavelength range from 100 nm to 280 nm. UV LEDs are of particular interest for use in applications related to the disinfection of microorganisms in air, water, and surfaces, among others. In other applications, UV LEDs may also be provided with one or more lumiphoric materials to provide LED packages with aggregated emissions having a broad spectrum and improved color quality for visible light applications.

As used herein, a layer or region of a light-emitting device may be considered to be "transparent" when at least 80% of emitted radiation that impinges on the layer or region emerges through the layer or region. Moreover, as used herein, a layer or region of an LED is considered to be "reflective" or embody a "mirror" or a "reflector" when at least 80% of the emitted radiation that impinges on the layer or region is reflected. In some embodiments, the emitted radiation comprises visible light such as blue and/or green LEDs with or without lumiphoric materials. In other embodiments, the emitted radiation may comprise nonvisible light. For example, in the context of GaN-based blue and/or green LEDs, silver (Ag) may be considered a reflective material (e.g., at least 80% reflective). In the case of UV LEDs, appropriate materials may be selected to provide a desired, and in some embodiments high, reflectivity and/or a desired, and in some embodiments low, absorption. In certain embodiments, a "light-transmissive" material may be configured to transmit at least 50% of emitted radiation of a desired wavelength.

The present disclosure may be useful for LED chips having a variety of geometries, including flip-chip geometries. Flip-chip structures for LED chips typically include anode and cathode connections that are made from a same side or face of the LED chip. The anode and cathode side is typically structured as a mounting face of the LED chip for flip-chip mounting to another surface, such as a printed circuit board. In this regard, the anode and cathode connections on the mounting face serve to mechanically bond and electrically couple the LED chip to the other surface. When flip-chip mounted, the opposing side or face of the LED chip corresponds with a light-emitting face that is oriented toward an intended emission direction. In certain embodiments, a growth substrate for the LED chip may form and/or be adjacent to the light-emitting face when flip-chip mounted. During chip fabrication, the active LED structure may be epitaxially grown on the growth substrate.

According to aspects of the present disclosure, LED packages may include one or more elements, such as cover structures with lumiphoric materials or phosphors for wavelength conversion, encapsulants, light-altering materials, lenses, and electrical contacts, among others, that are provided with one or more LED chips. In certain aspects, an LED package may include a support structure or member, such as a submount or a lead frame. A support structure may refer to a structure of an LED package that supports one or more other elements of the LED package, including but not limited to LED chips and cover structures. In certain embodiments, a support structure may include a submount on which an LED chip is mounted. Suitable materials for a submount include, but are not limited to, ceramic materials such as aluminum oxide or alumina, AlN, or organic insulators like polyimide (PI) and polyphthalamide (PPA). In other embodiments a submount may comprise a printed circuit board (PCB), sapphire, Si, or any other suitable material. For PCB embodiments, different PCB types can be used such as standard FR-4 PCB, metal core PCB, or any other type of PCB. In still further embodiments, the support structure may embody a lead frame structure. Aspects of the present disclosure are provided in the context of support structures for LED chips that may emit light in any number of wavelength ranges, including wavelengths within UV and/or visible light spectrums.

Light-altering materials may be arranged within LED packages to reflect or otherwise redirect light from the one or more LED chips in a desired emission direction or pattern. As used herein, light-altering materials may include many different materials including light-reflective materials that reflect or redirect light, light-absorbing materials that absorb light, and materials that act as a thixotropic agent. As used herein, the term "light-reflective" refers to materials or particles that reflect, refract, scatter, or otherwise redirect light. For light-reflective materials, the light-altering material may include at least one of fused silica, fumed silica, titanium dioxide ($TiO_2$), or metal particles suspended in a binder, such as silicone or epoxy. For light-absorbing materials, the light-altering material may include at least one of carbon, silicon, or metal particles suspended in a binder, such as silicone or epoxy. The light-reflective materials and the light-absorbing materials may comprise nanoparticles. In certain embodiments, the light-altering material may comprise a generally white color to reflect and redirect light. In other embodiments, the light-altering material may comprise a generally opaque or black color for absorbing light and increasing contrast.

An LED chip can also be covered or otherwise arranged to emit light toward one or more lumiphoric materials (also referred to herein as lumiphors), such as phosphors, such that at least some of the light from the LED chip is absorbed by the one or more lumiphors and is converted to one or more different wavelength spectra according to the characteristic emission from the one or more lumiphors. In this regard, at least one lumiphor receiving at least a portion of the light generated by the LED source may re-emit light having different peak wavelength than the LED source. An LED source and one or more lumiphoric materials may be selected such that their combined output results in light with one or more desired characteristics such as color, color point, intensity, etc. In certain embodiments, aggregate emissions of LED chips, optionally in combination with one or more lumiphoric materials, may be arranged to provide cool white, neutral white, or warm white light, such as within a color temperature range of from 2500 Kelvin (K) to 10,000 K. In certain embodiments, lumiphoric materials having cyan, green, amber, yellow, orange, and/or red peak wavelengths may be used. In some embodiments, the combination of the LED chip and the one or more lumiphors (e.g., phosphors) emits a generally white combination of light. The one or more phosphors may include yellow (e.g., YAG:Ce), green (e.g., LuAg:Ce), and red (e.g., $Ca_{i-x-y}Sr_x$-$Eu_yAlSiN_3$) emitting phosphors, and combinations thereof.

Lumiphoric materials as described herein may be or include one or more of a phosphor, a scintillator, a lumiphoric ink, a quantum dot material, a day glow tape, and the like. Lumiphoric materials may be provided by any suitable means, for example, dispersal in a host material or an encapsulant material. In certain embodiments, lumiphoric materials may be downconverting or upconverting, and combinations of both downconverting and upconverting materials may be provided. In certain embodiments, multiple different (e.g., compositionally different) lumiphoric materials arranged to produce different peak wavelengths may be arranged to receive emissions from one or more LED chips. In certain embodiments, one or more lumiphoric materials may be arranged on or over one or more surfaces of an LED chip in a substantially uniform manner. In other embodiments, one or more lumiphoric materials may be arranged on or over one or more surfaces of an LED chip in a manner that is non-uniform with respect to one or more of material composition, concentration, and thickness. In certain embodiments, the loading percentage of one or more lumiphoric materials may be varied relative to one or more outer surfaces of an LED chip. In certain embodiments, one or more lumiphoric materials may be patterned relative to one or more surfaces of an LED chip to include one or more stripes, dots, curves, or polygonal shapes. In certain embodiments, multiple lumiphoric materials may be arranged in different discrete regions or discrete layers on or over an LED chip.

In certain embodiments, one or more lumiphoric materials may be provided as at least a portion of a wavelength conversion element or cover structure for an LED package. Wavelength conversion elements or cover structures may include phosphor-in-glass or phosphor-in-ceramic arrangements. Phosphor-in-glass or ceramic arrangements may be formed by mixing phosphor particles with glass frit or ceramic materials, pressing the mixture into planar shapes, and firing or sintering the mixture to form a hardened structure that can be cut or separated into individual wavelength conversion elements. Wavelength conversion elements may be attached to one or more LED chips using, for example, a layer of transparent adhesive. In certain embodiments, the layer of the transparent adhesive may include silicone with a refractive index in a range of about 1.3 to about 1.6 that is less than a refractive index of the LED chip on which the wavelength conversion element is placed.

As described above, cover structures for LED packages may include lumiphoric materials, such as phosphors, in a host material that is hardened into a preformed structure before attachment. Exemplary host materials include glass and various ceramics. Lumiphoric materials are typically mixed throughout the host material to provide cover structures with uniformly distributed lumiphoric materials intended for uniform wavelength conversions in LED packages. However, such uniform mixing may not readily allow flexibility in tailoring arrangements of different types lumiphoric materials. According to aspects of the present disclosure, cover structures may include different lumiphoric material structures that are bonded together. Each lumiphoric material structure may be formed of lumiphoric materials in a host material, e.g., phosphor-in-glass or phosphor-in-ceramic, that are separately formed before being bonded together. In this manner, precise control of different loading percentages and/or different types of lumiphoric materials may be layered within cover structures. In still further aspects, individual ones of the lumiphoric material structures may include sublayers of different loading percentages and/or different types of lumiphoric materials that are arranged and set in place during hardening.

Additional improvements may be realized by the ability to separate and match different types of host material to particular lumiphoric materials. For example, lumiphoric materials that provide red wavelengths are known to degrade at lower temperatures than lumiphoric materials that provide yellow or green wavelengths. In this manner, a first lumiphoric material structure may include red lumiphoric materials in a first host material that may be hardened at a suitably low temperature for the red lumiphoric materials. A second lumiphoric material structure with yellow and/or green lumiphoric materials in a second host material may be hardened at a higher temperature. The first and second lumiphoric material structures may be bonded together to form a cover structure. The second lumiphoric material structure may exhibit an increased refractive index and/or increased mechanical integrity. In such examples, the second lumiphoric material structure may form an outer surface of the LED package that provides protection for the underlying first lumiphoric material structure.

FIGS. 1A to 1E illustrate a sequence of fabrication steps for forming a cover structure 10 that includes first and second lumiphoric material structures 12, 14. In FIG. 1A, the first lumiphoric material structure 12 and the second lumiphoric material structure 14 are separately formed and hardened before being assembled together. The first lumiphoric material structure 12 may be formed by mixing first lumiphoric particles and a first host material together and then performing a heating step to harden the first lumiphoric material structure 12. The second lumiphoric material structure 14 may be formed in a similar manner with second lumiphoric particles and a second host material. In this regard, the first and second particles and/or the first and second host materials can be different from one another to provide different optical properties, such as different wavelength conversions and/or different refractive indexes. As described above, different host materials may also be selected based on differences in degradation temperatures for lumiphoric particles, such as lower temperatures need for red lumiphoric particles than yellow and/or green lumiphoric particles. In certain embodiments, the first and second lumiphoric material structure 12, 14 of FIG. 1A may embody larger sheets that may be singulated into multiple first and second lumiphoric material structures 12, 14 at a later fabrication step.

Figure 1B:
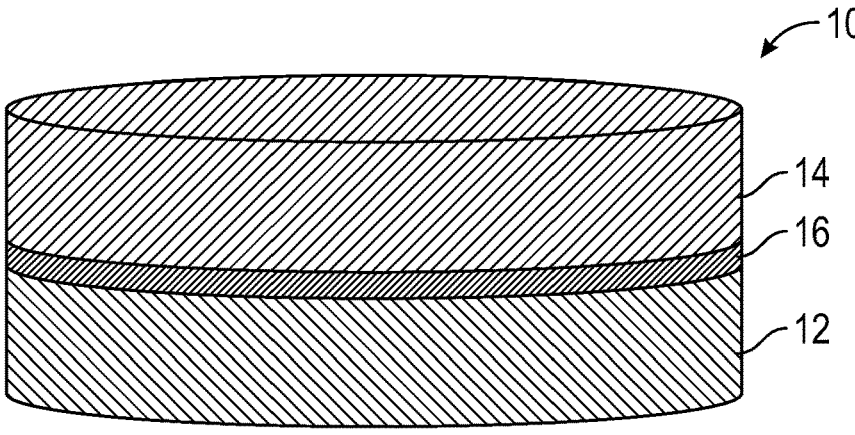
FIG. 1B is an illustration at a subsequent fabrication step to FIG. 1A where the first lumiphoric material structure is bonded to the second lumiphoric material structure with an adhesive material.

In FIG. 1B, the first lumiphoric material structure 12 is bonded to the second lumiphoric material structure 14 with an adhesive material 16. The adhesive material 16 may include various materials, such as silicone, epoxy, or glue. In other embodiments, the adhesive material 16 may be omitted and the first and second lumiphoric material structures 12, 14 may be bonded together by other techniques, such as inorganic bonding including diffusion bonding. In certain embodiments, the adhesive material 16 is light-transparent to wavelengths converted by the first and second lumiphoric material structures 12, 14 and wavelengths of light that are emitted by an LED chip arranged proximate the cover structure 10.

Figure 1C:
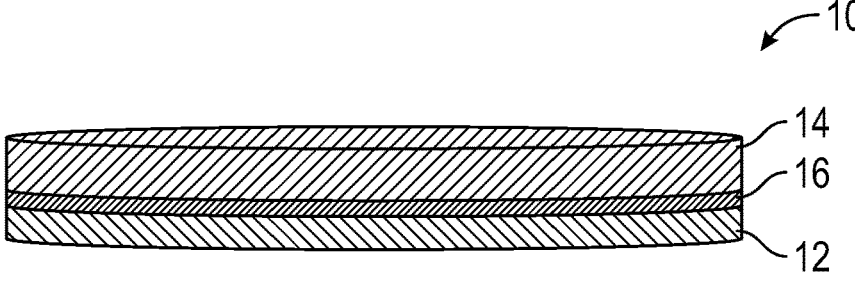
FIG. 1C is an illustration at a subsequent fabrication step to FIG. 1B where the first and second lumiphoric material structures are thinned to adjust their respective thicknesses.
Figure 1D:
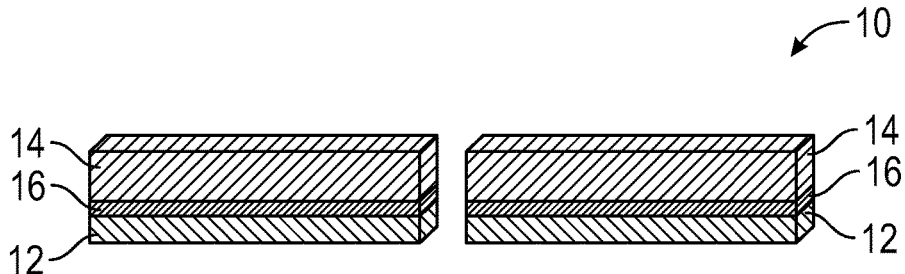
FIG. 1D is an illustration at a subsequent fabrication step after the cover structure is sub-divided into a number of smaller cover structures.

In FIG. 1C, the first and second lumiphoric material structures 12, 14 may optionally be thinned to adjust their respective thicknesses. For example, the first lumiphoric material structure 12 may be subjected to a first removal process, such as grinding, that effectively thins the first lumiphoric material structure 12. Next, the second lumiphoric material structure 14 may be subjected to a second removal process, such as grinding, that effectively thins the second lumiphoric material structure 14. In this manner, the first and second lumiphoric material structures 12, 14 may be thinned independently from one another after bonding. This provides the ability to have different thicknesses for each of the first and second lumiphoric material structures 12, 14 based on a target color point and a desired contribution to aggregate emission from each of the first and second lumiphoric material structures 12, 14. Additionally, it may be advantageous to perform the thinning steps after bonding the first and second lumiphoric material structures 12, 14 since the combined cover structure 10 may provide increased mechanical stability during thinning. In other embodiments, the first and second lumiphoric material structures 12, 14 may be pre-thinned before the bonding step of FIG. 1B and the fabrication step of FIG. 1C may be omitted. FIG. 1D illustrates a fabrication step after singulation where the cover structure 10 is sub-divided into a number of smaller cover structures 10. The singulation process may comprise dicing with one or more of a saw blade and a laser along separation lines between individual ones of the cover structures 10. In this manner, lateral dimensions of the cover structure 10 may be tailored to a particular LED package.

Figure 2:
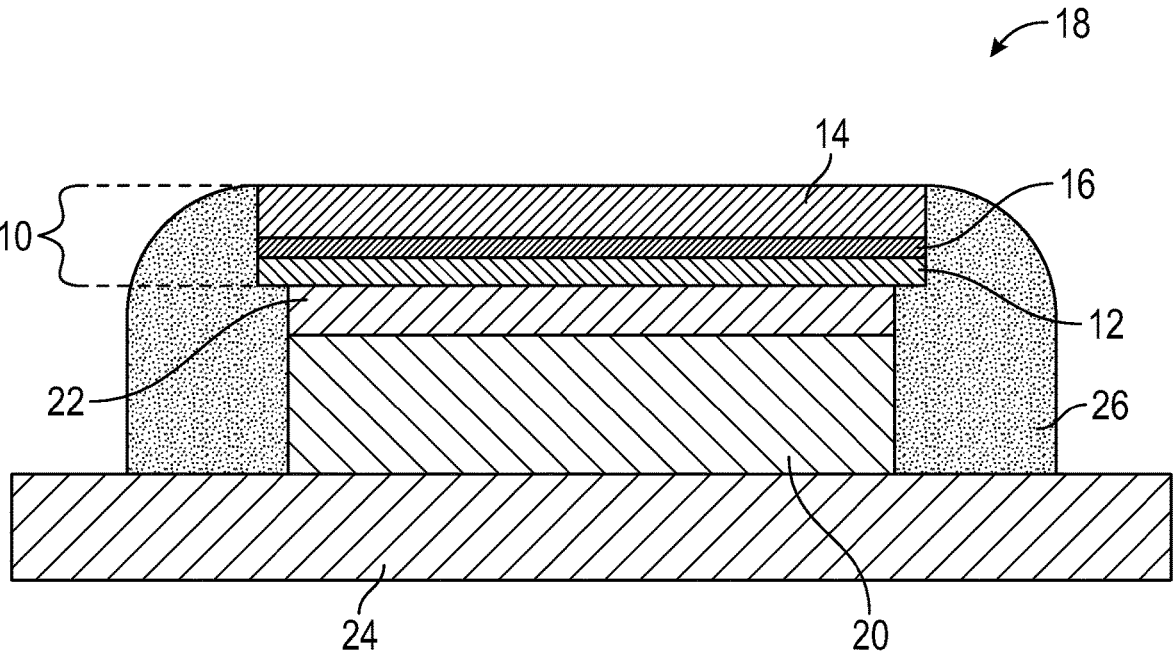
FIG. 2 is a cross-sectional view of a light-emitting diode (LED) package that includes the cover structure described above for FIGS. 1A to 1D.

FIG. 2 is a cross-sectional view of an LED package 18 that includes the cover structure 10 described above for FIGS. 1A to 1D. The cover structure 10 may be attached to an LED chip 20 by way of a second adhesive material 22, wherein the adhesive material 16 between the first and second lumiphoric material structures 12, 14 may be referred to as a first adhesive material 16. The second adhesive material 22 may include various materials, such as silicone, epoxy, or glue in a similar manner as the first adhesive material 16. In certain embodiments, the first and second adhesive materials 16, 22 are configured to be light-transparent to wavelengths of light emitted by the LED chip 20 and wavelengths of light converted by the first and second lumiphoric material structures 12, 14. The LED chip 20 may be mounted on a submount 24 and in certain embodiments, a light-altering material 26 may be arranged on the submount 24 proximate the LED chip 20 and the cover structure 10. The light-altering material 26 may laterally surround peripheral edges of the LED chip 20 and the cover structure 10 to redirect laterally propagating light to exit the LED package 18 through a top surface of the cover structure 10.

The first and second lumiphoric material structures 12, 14 may be configured to provide different wavelengths of light. For example, the LED chip 20 may be configured to emit a first peak wavelength, such as blue light in a range from 430 nm to 480 nm, the first lumiphoric material structure 12 may include lumiphoric particles that convert a portion of the first peak wavelength to light of a second peak wavelength, such as light in a range from 600 nm to 650 nm, and the second lumiphoric material structure 14 may include lumiphoric particles that convert a portion of the first peak wavelength to light of a third peak wavelength, such as light in a range from 480 nm to 590 nm. In certain embodiments, the arrangement of the first and second lumiphoric material structures 12, 14 may be based on excitation spectrums for their respective lumiphoric particles. For example, red lumiphoric materials that provide light in a range from 600 nm to 650 nm may have excitation spectrums that overlap with emission spectrums of yellow or green lumiphoric materials. As such, light that may initially be converted by the yellow or green lumiphoric materials may subsequently be converted again by the red lumiphoric material, thereby limiting emission efficiencies. In this regard, the LED package 18 may exhibit improved emission efficiency by providing the first lumiphoric material structure 12 between the second lumiphoric material structure 14 and the LED chip 20 so that the red wavelengths are first converted, and the yellow or green wavelengths are converted just before light exits the LED package 18. In other embodiments, the order could be reversed such that higher wavelength lumiphoric particles are in the second lumiphoric material structure 14, and any overlapping emission and excitation spectrums could be factored in to target a particular color point.

Figure 3A:
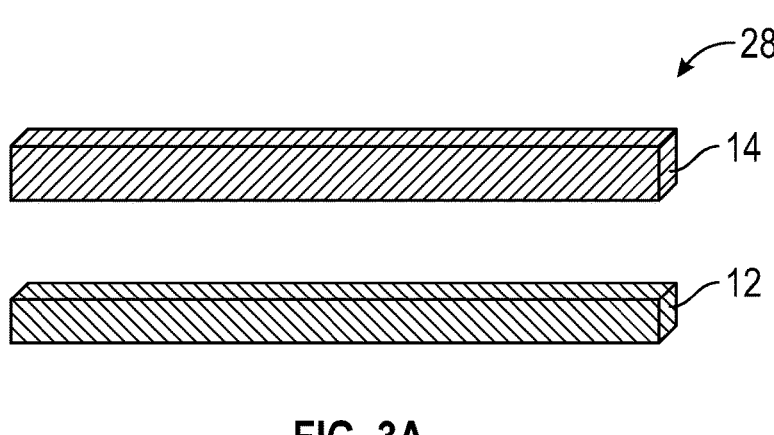
FIG. 3A is an illustration of a fabrication step that is similar to the fabrication step of FIG. 1A except the first and second lumiphoric material structures of a cover structure are first singulated before they are attached to one another.
Figure 3B:
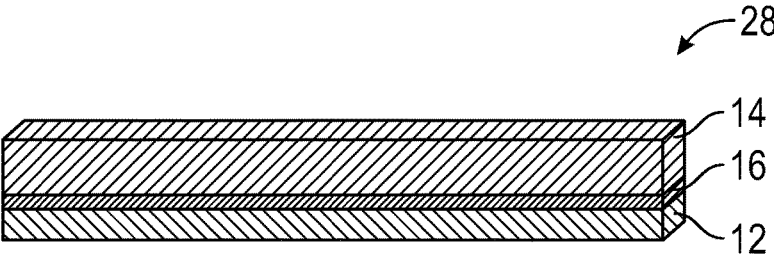
FIG. 3B is an illustration at a subsequent fabrication step to FIG. 3A where the first lumiphoric material structure is bonded to the second lumiphoric material structure with an adhesive material.
Figure 3C:
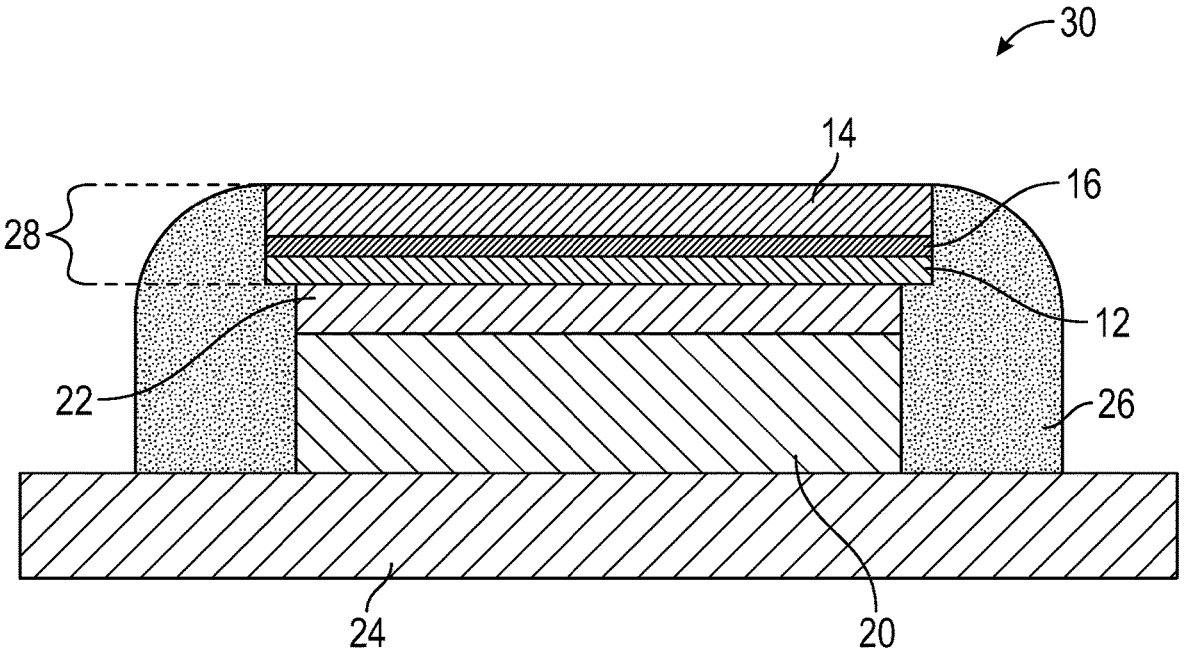
FIG. 3C is an illustration at a subsequent fabrication step to FIG. 3B where the cover structure is attached to an LED chip of an LED package.

FIGS. 3A to 3C illustrate a sequence of fabrication steps that are similar to the fabrication steps of FIGS. 1A to 1D and an LED package similar to the LED package 18 of FIG. 2 for embodiments where the first and second lumiphoric material structures 12, 14 of a cover structure 28 are singulated before they are attached to one another. In FIG. 3A, the first and second lumiphoric material structures 12, 14 are separately formed and hardened before being assembled together. Accordingly, the final form factor for the first and second lumiphoric material structures 12, 14 may be predefined. That is, the size and thickness of each are provided before the attachment step of FIG. 3B. The first and second lumiphoric material structures 12, 14 may each still be formed from larger structures as described above; however, each have been separately singulated in FIG. 3A. In FIG. 3B, the first lumiphoric material structure 12 is bonded to the second lumiphoric material structure 14 with an adhesive material 16 to form the cover structure 28 in a similar manner described above for FIG. 1B. Finally, as illustrated in FIG. 3C, the cover structure 28 is attached to the LED chip 20 of an LED package 30 in a similar manner as described above for FIG. 2.

Figure 4A:
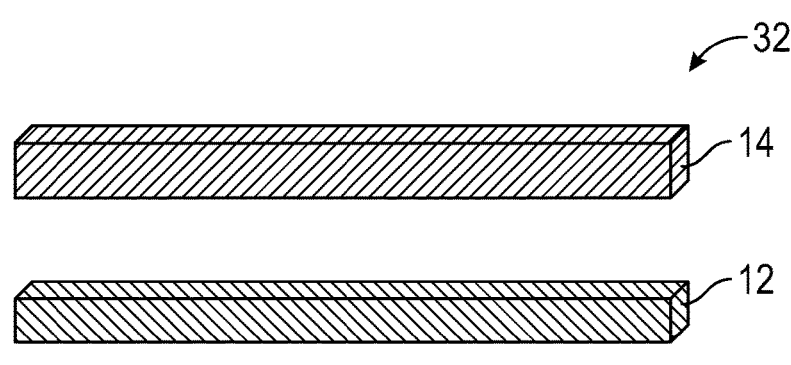
FIG. 4A is an illustration of a fabrication step that is similar to the fabrication step of FIG. 3A except the cover structure is assembled at the LED package level.
Figure 4B:
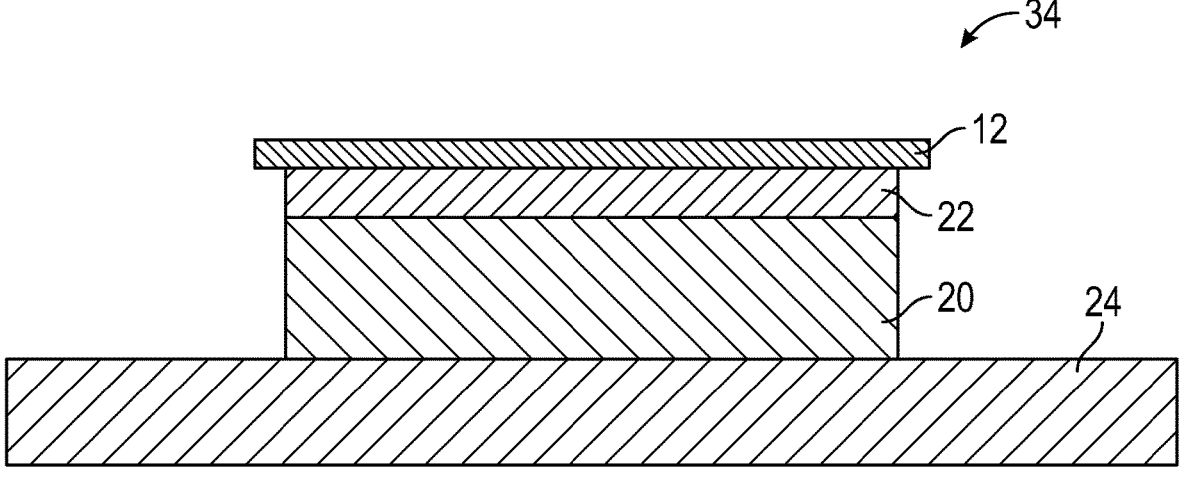
FIG. 4B is an illustration at a subsequent fabrication step to FIG. 4A where the first lumiphoric material structure is attached to an LED chip of an LED package.
Figure 4C:
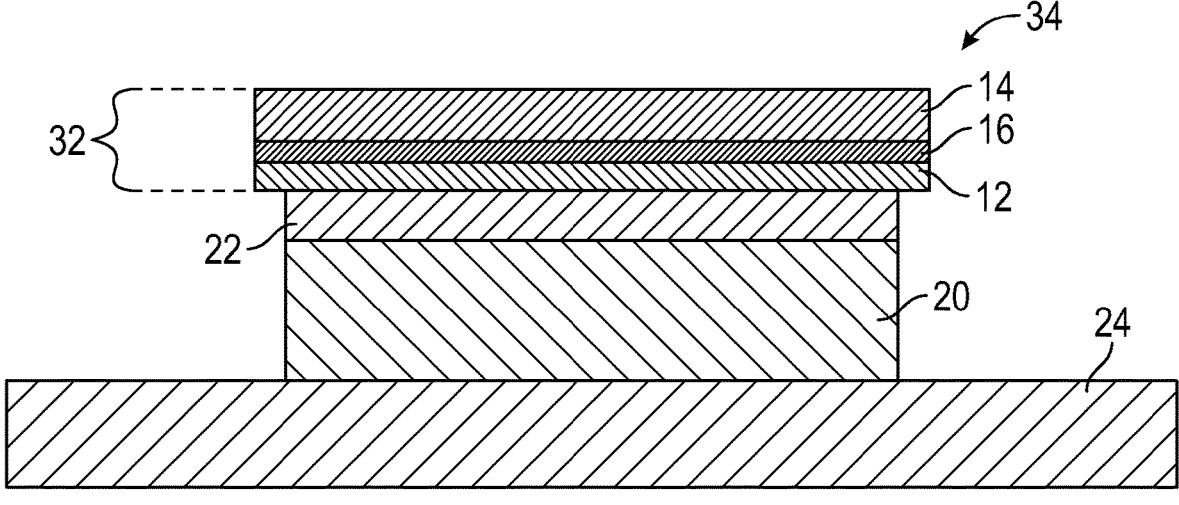
FIG. 4C is an illustration at a subsequent fabrication step to FIG. 4B where the cover structure is fully assembled by attaching the second lumiphoric material structure to the first lumiphoric material structure.

FIGS. 4A to 4C illustrate a sequence of fabrication steps that are similar to the fabrication steps of FIGS. 3A to 3C for a cover structure 32 and an LED package 34 where the cover structure 32 is assembled at the package level. In FIG. 4A, the first and second lumiphoric material structures 12, 14 are separately formed and hardened in a similar manner as illustrated in FIG. 3A. In FIG. 4B, the first lumiphoric material structure 12 is attached to the LED chip 20 by way of the second adhesive material 22. In FIG. 4C, the second lumiphoric material structure 14 is bonded to the first lumiphoric material structure 12 by way of the first adhesive material 16 to form the cover structure 32. In this manner, the cover structure 32 is formed on the LED chip 20 after the LED chip is mounted to the submount 24. The remainder of the LED package 34 may include the light-altering material 26 as described above for FIG. 3C or other elements that are provided after the cover structure 32 is formed.

According to aspects of the present disclosure, lumiphoric material structures may be tailored with optical arrangements that may provide desired emission characteristics including brightness, uniformity, and emission patterns for associated LED packages. In certain aspects, individual lumiphoric material structures may be fabricated by providing thin sheets of precursor materials, (e.g., glass frit, ceramic materials, binders and the like) where one or more of the thin sheets are pressed and fired together. One or more of the lumiphoric material structures may be bonded together to form a cover structure. In certain aspects, individual sheets of precursor materials may be provided with varying quantities and/or varying types of lumiphoric particles to form a lumiphoric material structure where phosphor particles vary in a vertical and/or horizontal direction.

Figure 5A:
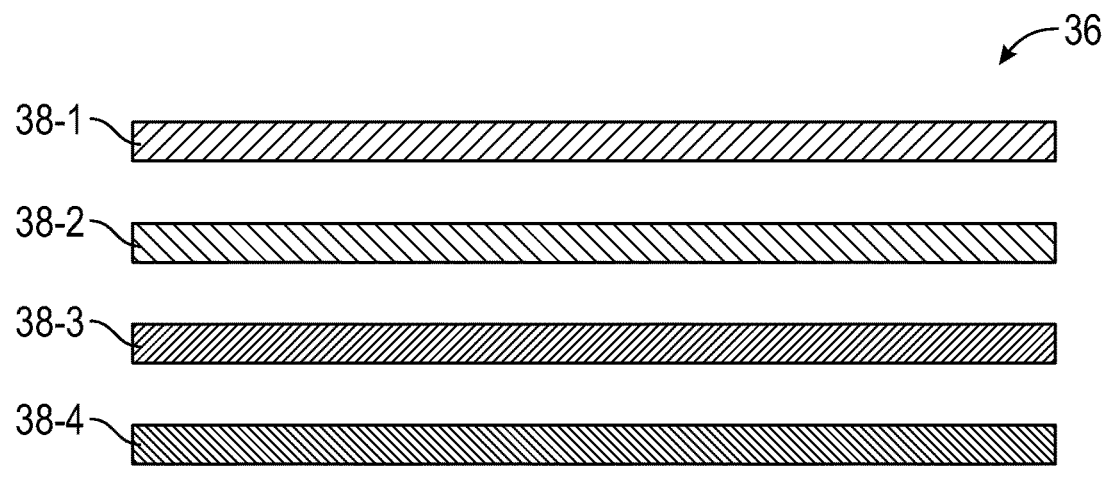
FIG. 5A illustrates a view at a first fabrication step for a lumiphoric material structure with varying lumiphoric particle arrangements where multiple sheets of precursor materials are provided that have different lumiphoric particle arrangements from one another.
Figure 5B:
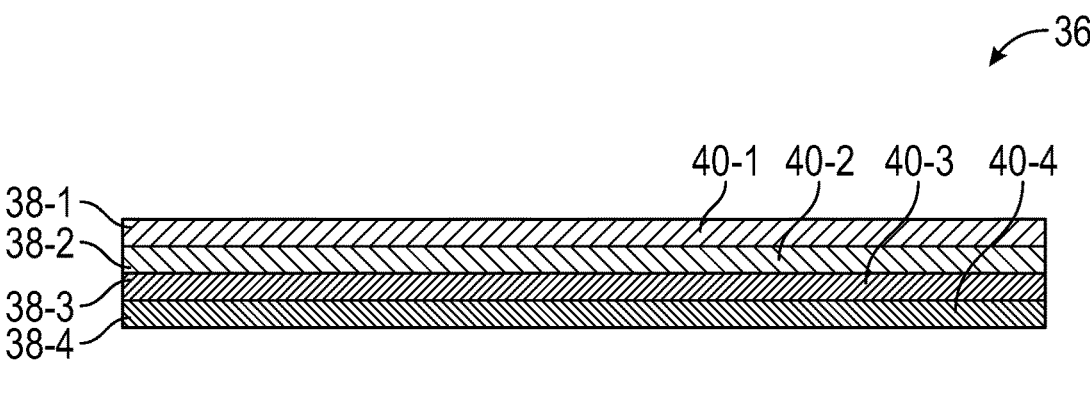
FIG. 5B illustrates a cross-sectional view at a second fabrication step where the multiple sheets of FIG. 5A are pressed together and fired to form the lumiphoric material structure.
Figure 5C:
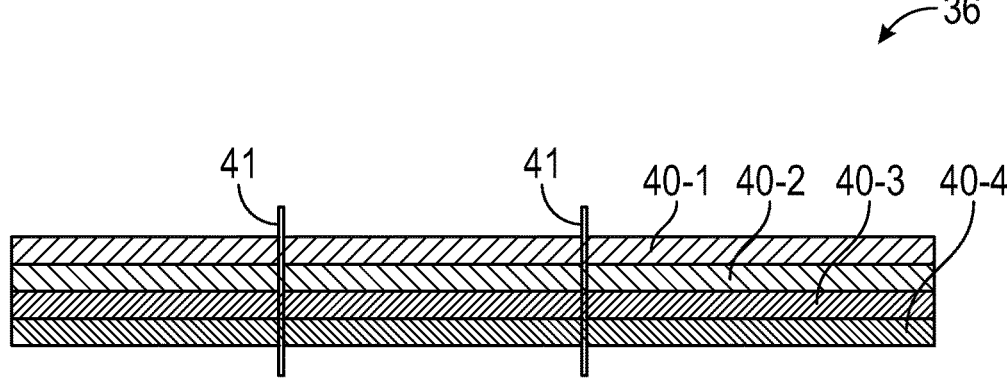
FIG. 5C illustrates a cross-sectional view at a third fabrication step where the lumiphoric material structure may be singulated.

FIGS. 5A-5C illustrate an exemplary fabrication process for forming a lumiphoric material structure 36 with varying lumiphoric particle arrangements according to principles of the present disclosure. FIG. 5A illustrates a cross-sectional view at a first fabrication step where multiple sheets 38-1 to 38-4 of precursor materials are provided that have different lumiphoric particle arrangements from one another. In certain embodiments, a precursor material for a glass plate may comprise glass frit and a corresponding binder, and a precursor material for a ceramic plate may comprise ceramic materials and a corresponding binder. The precursor materials may typically be formed as a slurry that is dried to form the corresponding sheets 38-1 to 38-4. As described herein, the sheets 38-1 to 38-4 may sometimes be referred to as green sheets that refer to composite sheets before firing. By way of example, each of the sheets 38-1 to 38-4 may comprise lumiphoric particles that are provided with different loading amounts or compositions within the precursor material. For example, the quantity of lumiphoric particles may progressively decrease from the first sheet 38-1 toward the last sheet 38-4. Depending on the desired emission characteristics, the loading amounts of lumiphoric particles may be provided in other arrangements, including progressively increasing amounts from the first sheet 38-1 toward the last sheet 38-4, or distributions increasing and decreasing from the first sheet 38-1 toward the last sheet 38-4. In certain embodiments, the type or composition of the lumiphoric particles may varied, such as yellow and/or green lumiphoric particles for certain sheets (e.g., 38-1 to 38-2) and red lumiphoric particles for other sheets (e.g., 38-3 to 38-4).

While FIG. 5A is illustrated with four sheets 38-1 to 38-4, the concepts disclosed may be applicable to any number of sheets. In certain embodiments, the number of sheets 38-1 to 38-4 comprises a range from 2 to 10 sheets, or a range from 2 to 8 sheets, or a range from 2 to 6 sheets. Thickness ranges for the sheets 38-1 to 38-4 may be tailored to particular applications, with some ranges being provided in a range from 20 microns (μm) to 500 μm, or in a range from 20 μm to 300 μm, or in a range from 50 μm to 250 μm, or in a range from 100 μm to 200 μm.

FIG. 5B illustrates a cross-sectional view at a second fabrication step where the multiple sheets 38-1 to 38-4 of FIG. 5A are pressed together and fired to form the lumiphoric material structure 36. As illustrated, each of the sheets 38-1 to 38-4 forms corresponding sublayers 40-1 to 40-4 of the lumiphoric material structure 36. During firing, binder materials of the sheets 38-1 to 38-4 are reduced and/or removed, thereby providing the lumiphoric material structure 36 as a rigid structure with the various sublayers 40-1 to 40-4 having different lumiphoric particles. As binder materials are removed during firing, the lumiphoric material structure 36 may comprise a compressed thickness relative to a sum of the respective sheets 38-1 to 38-4 before pressing and firing.

FIG. 5C illustrates a cross-sectional view at a third fabrication step where the lumiphoric material structure 36 may be singulated. In certain embodiments, singulation may involve sub-dividing the lumiphoric material structure 36 into a number of smaller lumiphoric material structures 36 sized for placement in a corresponding number of LED packages. As illustrated in FIG. 5C, two vertical separation lines 41 are superimposed where the lumiphoric material structure 36 may be divided. The singulation process may comprise dicing with one or more of a saw blade and a laser along the separation lines 41. In this manner, lateral dimensions of each lumiphoric material structure 36 may be tailored to a particular LED chip and/or LED package.

Figure 6:
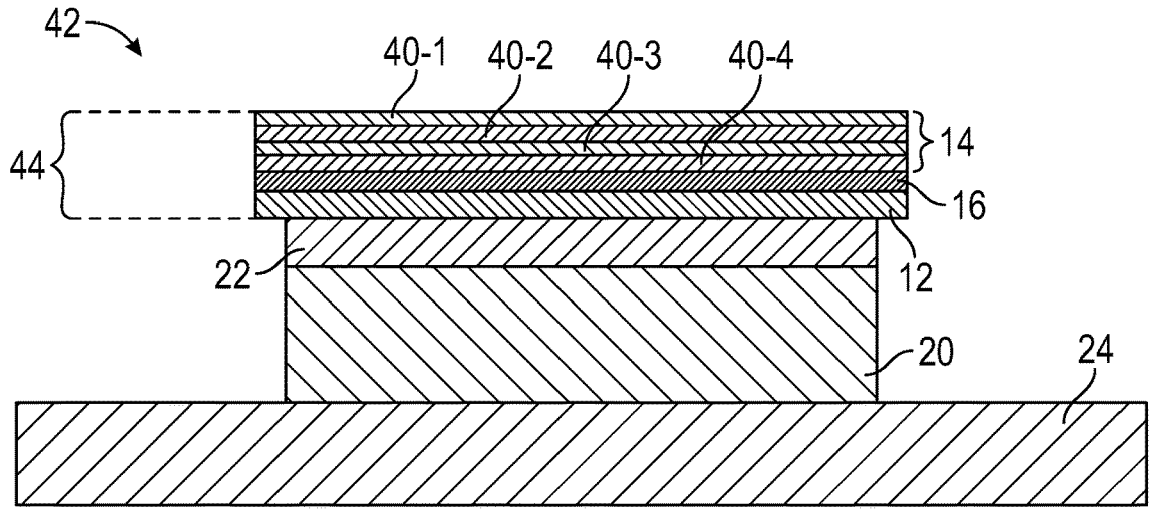
FIG. 6 is a cross-sectional view of an LED package that includes a cover structure that is similar to the LED package of FIG. 2 except the second lumiphoric material structure is formed in a similar manner as the lumiphoric material structure of FIGS. 5A to 5C.

FIG. 6 is a cross-sectional view of an LED package 42 that includes a cover structure 44 that is similar to the LED package 18 of FIG. 2 except the second lumiphoric material structure 14 is formed in a similar manner as the lumiphoric material structure 36 of FIGS. 5A to 5C. In this manner, the second lumiphoric material structure 14 may include a number of sublayers 40-1 to 40-4 of varying quantities and/or compositions of lumiphoric particles. For example, the quantity of lumiphoric particles may progressively decrease in a direction from the sublayer 40-4 to the sublayer 40-1. In another example, the composition of the lumiphoric particles may vary, such as alternating green and yellow lumiphoric particles along the sublayers 40-1 to 40-4. In certain embodiments, the LED package 42 may include the light-altering material 26 as described above for FIG. 2. While only the second lumiphoric material structure 14 is illustrated with the sublayers 40-1 to 40-4 of varying quantities and/or compositions of lumiphoric particles, the order may be reversed such that the first lumiphoric material structure 12 may be formed with sublayers of varying quantities and/or compositions of lumiphoric particles. In still further embodiments, the first lumiphoric material structure 12 may be formed with sublayers of varying quantities and/or compositions of lumiphoric particles in combination with the varying sublayers 40-1 to 40-4 of the second lumiphoric material structure 14.

Figure 7:
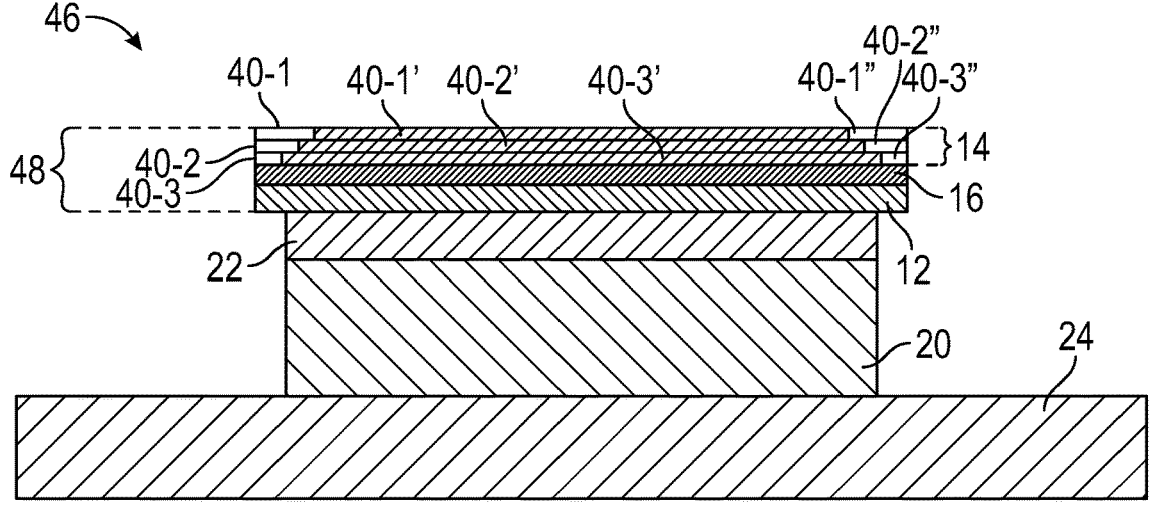
FIG. 7 is a cross-sectional view of an LED package that is similar to FIG. 6 and includes a cover structure where at least one of the lumiphoric material structures comprises sublayers with laterally varying lumiphoric particles.

FIG. 7 is a cross-sectional view of an LED package 46 that is similar to FIG. 6 and includes a cover structure 48 where at least one of the lumiphoric material structures 12, 14 comprises sublayers 40-1 to 40-2 with laterally varying lumiphoric particles. In certain aspects, the lumiphoric particles may be arranged only in portions of the sublayers 40-1 to 40-2. In FIG. 7, the sublayer 40-1 may be laterally subdivided in a number of subregions 40-1', 40-1" that are arranged with varying lumiphoric particles. For example, the subregion 40-1' may comprise lumiphoric particles and the subregion 40-1" may be devoid of lumiphoric particles and predominantly be formed of the host material. In certain embodiments, the subregion 40-1" may be laterally arranged about a perimeter of the subregion 40-1' to improve and/or tailor color over angle emissions. The other sublayers 40-2 to 40-3 may also be respectively subdivided into subregions 40-2', 40-2" and 40-3', 40-3". In certain embodiments, lateral widths of the subregions 40-1' to 40-3' with lumiphoric particles may vary, such as progressively increasing from the sublayer 40-1 to the sublayer 40-3. In this manner, the widest subregion 40-3' of lumiphoric particles may be arranged closest to the LED chip 20 and the narrowest subregion 40-1' of lumiphoric particles maybe arranged farthest from the LED chip 20 to provide enhanced color over angle aggregate emissions.

Figure 8:
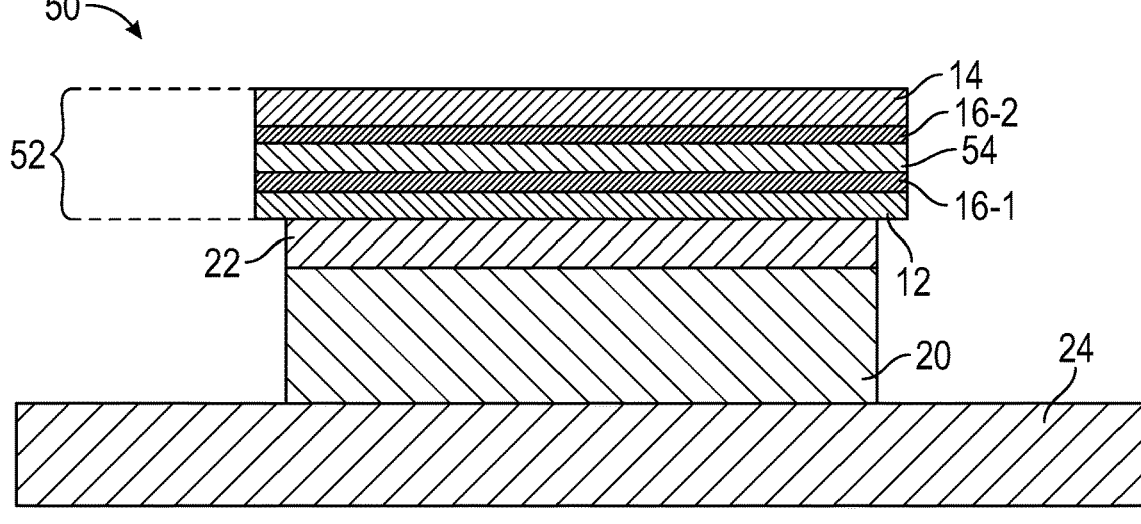
FIG. 8 is a cross-sectional view of an LED package that is similar to the LED package of FIG. 2 for embodiments where a cover structure includes a third lumiphoric material structure in addition to the first and second lumiphoric material structures.

FIG. 8 is a cross-sectional view of an LED package 50 that is similar to the LED package 18 of FIG. 2 for embodiments where a cover structure 52 includes a third lumiphoric material structure 54 in addition to the first and second lumiphoric material structures 12, 14. The third lumiphoric material structure 54 may formed in a similar manner as described above for the first and second lumiphoric material structures 12, 14. Adhesive materials 16-1, 16-2 as described for FIG. 1B may be provided to bond the lumiphoric material structures 12, 14, 54 together. In certain embodiments, each of the lumiphoric material structures 12, 14, 54 of the LED package 50 may be formed with different loading and/or compositions of lumiphoric particles. In certain embodiments, each of the lumiphoric material structures 12, 14, 54 may be formed with different thicknesses from one another to target various color points. By way of example, the first lumiphoric material structure 12 may include red lumiphoric particles, the second lumiphoric material structure 14 may include yellow lumiphoric particles, and the third lumiphoric material structure 54 may include green lumiphoric particles.

In certain aspects, preformed lumiphoric material structures as described herein may subsequently be reduced to powder form. A powder of particles formed from a lumiphoric material structure may then be arranged in a similar manner as lumiphoric particles on an LED chip, including being mixed in a binder and dispensed and/or spray-deposited on surfaces of the LED chip and corresponding submount. A preformed lumiphoric material structure may be pre-tuned to a particular color point by a precise arrangement of sublayers as described above. Once the lumiphoric material structure is reduced to powder form, each particle, or most particles, derived from the lumiphoric material structure may accordingly have a same targeted color point, thereby providing enhanced color mixing compared with conventional mixed lumiphoric materials. For conventional mixed lumiphoric materials, different lumiphoric compositions may have different average particle sizes, thereby making suitable mixing more challenging as particles may settle in different manners. By way of example, a preformed lumiphoric material structure as disclosed herein may include one or more sublayers of red lumiphoric materials and one or more sublayers of yellow and/or green lumiphoric materials. When reduced to power form, each particle may include portions of the red sublayers and portions of the yellow and/or green sublayers. Once the powder is mixed in a binder, such as silicone, the various colors provided by each of the sublayers may be present at each particle.

Figure 9A:
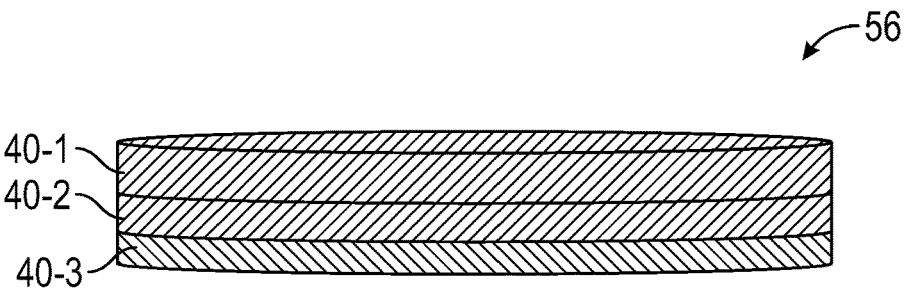
FIG. 9A is an illustration of a first fabrication step for reducing a lumiphoric material structure into a powder of particles of the lumiphoric material structure.
Figure 9B:
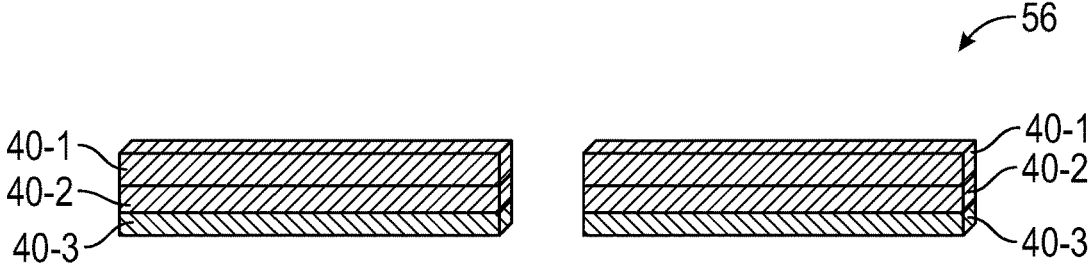
FIG. 9B is an illustration of a subsequent fabrication step to FIG. 9A where the lumiphoric material structure may be divided into a number of smaller lumiphoric material structures.
Figure 9C:
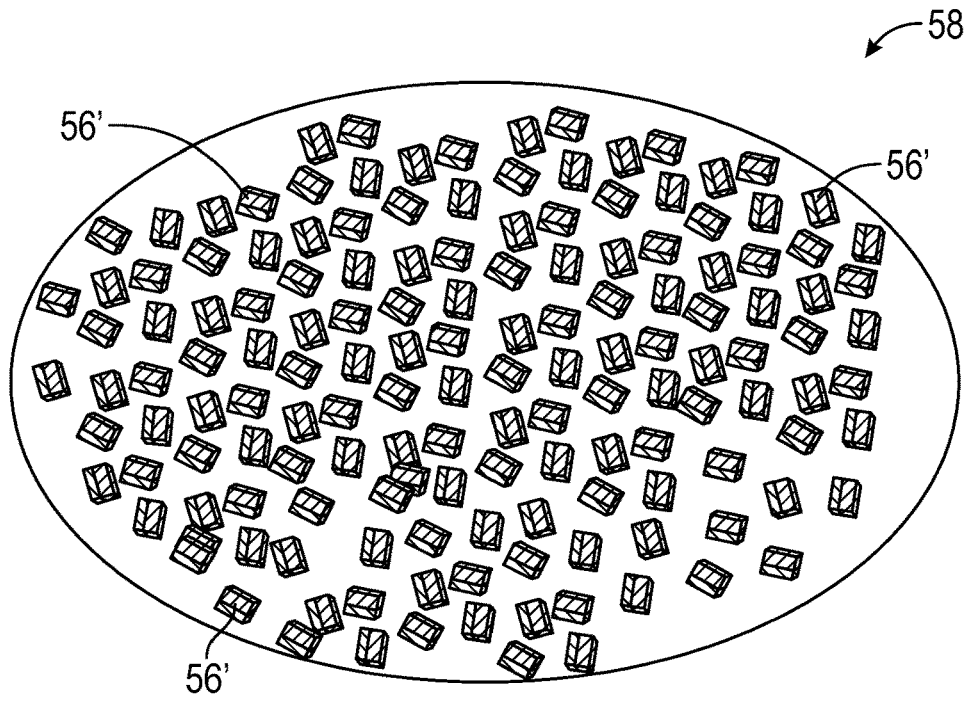
FIG. 9C is an illustration of a subsequent fabrication step to FIG. 9B after the powder of particles is formed from the lumiphoric material structure of FIG. 9A.

FIGS. 9A to 9C illustrate various fabrication steps for reducing a lumiphoric material structure 56 into a powder 58. In FIG. 9A, the lumiphoric material structure 56 may include a number of the sublayers 40-1 to 40-3 as described above. By way of example, the sublayers 40-1 and 40-2 may include yellow and/or green lumiphoric materials in a host material, and the sublayer 40-3 may include red lumiphoric materials in a same or different host material. The lumiphoric material structure 56 may initially be fabricated according to FIGS. 5A to 5C. In FIG. 9B, the lumiphoric material structure 56 may be divided into a number of smaller lumiphoric material structures 56, although this step may be optional. FIG. 9C is a top view of the powder 58 formed from the lumiphoric material structure 56 of FIG. 9A. To form the powder 58, the lumiphoric material structure 56 may be subjected to a mechanical process, such as grinding and/or milling. In certain embodiments, the mechanical process may form the powder 58 as generally uniform particles 56' of the lumiphoric material structure 56. Each particle 56' may include a portion of each of the sublayers 40-1 to 40-3 and accordingly, each particle 56' may provide same or similar wavelengths of converted light in response to receiving light from an LED chip. As indicated above, the portions of the sublayers 40-1 to 40-3 may be formed of lumiphoric materials in a host material. In this regard, each particle 56' may include lumiphoric materials that are at least partially encapsulated by the host material, such as glass or ceramic. The particular type of host material may be selected to provide an index of refraction step between the lumiphoric materials and an outside environment, such as a binder that the particles 56' may subsequently be suspended in.

Figures 10, 11:
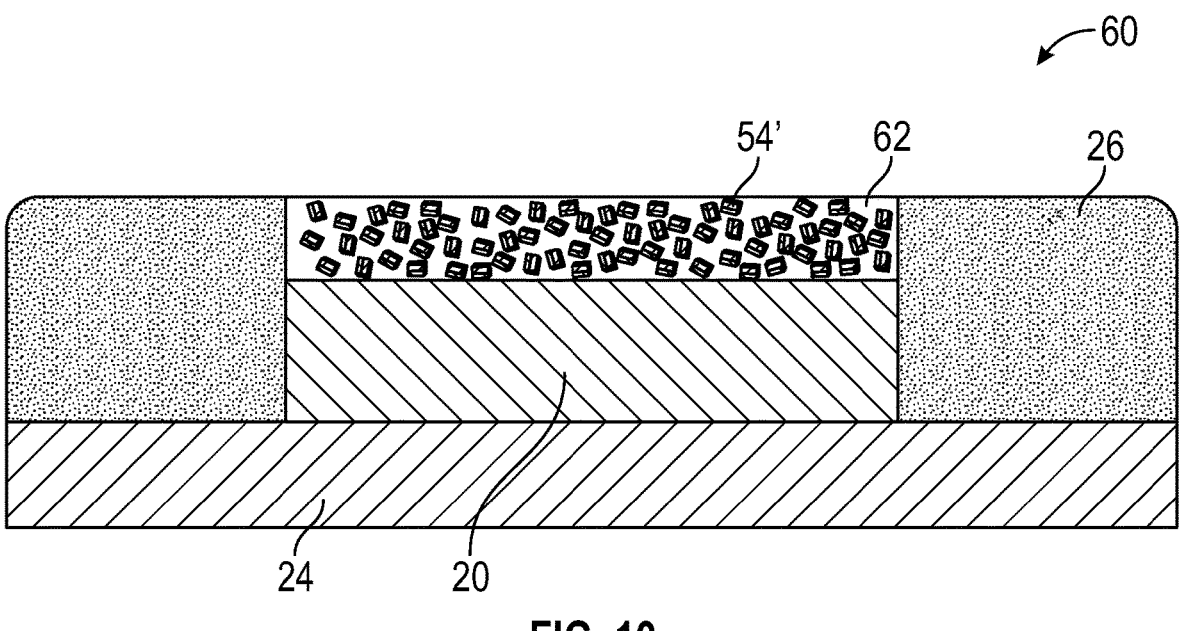
FIG. 10 is a cross-sectional view of an LED package that includes the particles of the powder of FIG. 9C distributed within a binder and arranged proximate a top surface of the LED chip.
FIG. 11 is a cross-sectional view of an LED package that is similar to LED package of FIG. 10 for embodiments where the particles and binder may be deposited on the LED chip and on surfaces of the submount adjacent the LED chip.

FIG. 10 is a cross-sectional view of an LED package 60 that includes the particles 56' of the powder 58 of FIG. 9C distributed within a binder 62 and arranged proximate a top surface of the LED chip 20. As described above, the lumiphoric material structure 56 of FIG. 9A may be reduced to the powder of particles 56' of FIG. 9C. The particles 56' may then be mixed within the binder 62, such as silicone, and formed on the LED chip 20. In FIG. 10, the particles 56' are formed on a top surface of the LED chip 20, and the light-altering material 26 is provided to laterally surround a perimeter of the LED chip 20. In this manner, laterally propagating light from the LED chip 20 may be redirected by the light-altering material 26 toward the particles 56' before exiting the LED package 60. Since a majority of the particles 56' may include multiple-colored lumiphoric materials as defined by the sublayers 40-1 to 40-3 of the lumiphoric material structure 56 of FIG. 9A, each particle 56' may effectively provide a same or similar wavelength of converted light for the LED package 60.

FIG. 11 is a cross-sectional view of an LED package 64 that is similar to LED package 60 of FIG. 10 for embodiments where the particles 56' and binder 62 may be deposited on the LED chip 20 and on surfaces of the submount 24 adjacent the LED chip 20. For example, the particles 56' may then be mixed within the binder 62 and spray deposited to conformally cover the LED chip 20 including sidewalls thereof and portions of the submount 24 that are uncovered by the LED chip 20. In this manner, laterally propagating light from the LED chip 20 may interact with laterally arranged particles 56' that provide a same or similar color point as other particles 56' distributed above the LED chip 20. Such an arrangement may be advantageous to ensure suitable distribution of multiple colored lumiphoric materials throughout the binder 62, as opposed to conventional mixed lumiphoric particles that could experience settling and segregation based on different particle sizes and different compositions.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A light-emitting diode (LED) package comprising:
a submount;
at least one LED chip on the submount;
a cover structure on the at least on LED chip, the cover structure comprising a first lumiphoric material structure that is bonded to a second lumiphoric material structure, and a first adhesive material between the first lumiphoric material structure and the second lumiphoric material structure, wherein at least one of the first lumiphoric material structure and the second lumiphoric material structure comprises a plurality of compressed sublayers with laterally varying quantities or compositions of lumiphoric particles; and
a second adhesive material between the first lumiphoric material structure and the at least one LED chip.

2. The LED package of claim 1, wherein each of the first lumiphoric material structure and the second lumiphoric material structure comprises a phosphor-in-glass structure or a phosphor-in-ceramic structure.

3. The LED package of claim 1, wherein:
the at least one LED chip is configured to emit light of a first peak wavelength;

the first lumiphoric material structure is configured to convert a portion of the first peak wavelength to light of a second peak wavelength;
the second lumiphoric material structure is configured to convert another portion of the first peak wavelength to light of a third peak wavelength; and
the first peak wavelength, the second peak wavelength, and the third peak wavelength are all different from one another.

4. The LED package of claim 3, wherein:
the first lumiphoric material structure is arranged closer to the at least one LED chip than the second lumiphoric material structure; and
the second peak wavelength is greater than the third peak wavelength.

5. The LED package of claim 1, wherein the first adhesive material and the second adhesive material are light-transparent to wavelengths of light provided by the first lumiphoric material structure and the second lumiphoric material structure.

6. The LED package of claim 1, wherein a first thickness of the first lumiphoric material structure is less than a second thickness of the second lumiphoric material structure.

7. The LED package of claim 1, wherein the first lumiphoric material structure comprises the plurality of compressed sublayers with varying quantities or compositions of lumiphoric particles and the second lumiphoric material structure comprises another plurality of compressed sublayers with varying quantities or compositions of lumiphoric particles.

8. The LED package of claim 1, wherein at least one sublayer of the plurality of sublayers comprises a first subregion that includes lumiphoric particles and a second subregion that is devoid of lumiphoric particles.

9. The LED package of claim 8, wherein the second subregion is laterally arranged about a perimeter of the first subregion.

10. The LED package of claim 1, wherein the cover structure comprises a third lumiphoric material structure that is bonded to the second lumiphoric material structure.

* * * * *